(12) United States Patent
Zheng et al.

(10) Patent No.: US 11,081,035 B2
(45) Date of Patent: Aug. 3, 2021

(54) SHIFT REGISTER UNIT, DRIVING METHOD, GATE DRIVING CIRCUIT AND DISPLAY PANEL

(71) Applicants: Hefei Xinsheng Optoelectronics Technology Co., Ltd., Hefei (CN); BOE TECHNOLOGY GROUP CO., LTD., Beijing (CN)

(72) Inventors: Mindong Zheng, Beijing (CN); Hui Wang, Beijing (CN); Yifeng Zou, Beijing (CN); Qiang Liu, Beijing (CN); Ruiying Yang, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/859,040

(22) Filed: Apr. 27, 2020

(65) Prior Publication Data

US 2021/0134204 A1 May 6, 2021

(30) Foreign Application Priority Data

Nov. 4, 2019 (CN) .......................... 201911067788.7

(51) Int. Cl.
| | | |
|---|---|---|
| G11C 19/28 | (2006.01) | |
| G09G 3/20 | (2006.01) | |
| G09G 3/36 | (2006.01) | |
| G09G 3/3266 | (2016.01) | |

(52) U.S. Cl.
CPC ............. *G09G 3/20* (2013.01); *G09G 3/3266* (2013.01); *G09G 3/3677* (2013.01); *G11C 19/28* (2013.01); *G11C 19/287* (2013.01); *G09G 2310/0286* (2013.01)

(58) Field of Classification Search
CPC ...... G09G 3/20; G09G 3/3266; G09G 3/3677; G09G 2300/0408; G09G 2310/0286; G11C 19/28; G11C 19/287
See application file for complete search history.

(56) References Cited

U.S. PATENT DOCUMENTS

| | | | | |
|---|---|---|---|---|
| 10,593,245 B2 * | 3/2020 | Wang | ........................ | G09G 3/20 |
| 10,854,130 B2 * | 12/2020 | Wang | .................... | G09G 3/2092 |
| 10,885,863 B2 * | 1/2021 | Zheng | .................. | G09G 3/3614 |

(Continued)

*Primary Examiner* — Patrick O Neill
(74) *Attorney, Agent, or Firm* — Thomas Horstemeyer, LLP

(57) ABSTRACT

The present disclosure provides to a shift register unit, a driving method, a gate driving circuit, and a display panel. The shift register unit includes: first and second signal terminals respectively outputting high and low levels alternately, a level logic of a signal output from the second signal terminal being opposite to that from the first signal terminal; first and second pull-down control circuits; a first pull-down circuit coupled to the first pull-down node, the first signal terminal, and a pull-down target node, and transmitting, in response to a signal of the first pull-down node, the signal of the first signal terminal to the pull-down target node; a second pull-down circuit coupled to the second pull-down node, the second signal terminal, and the pull-down target node, and transmitting, in response to a signal of the second pull-down node, the signal of the second signal terminal to the pull-down target node.

20 Claims, 3 Drawing Sheets

(56) References Cited

U.S. PATENT DOCUMENTS

| | | | |
|---|---|---|---|
| 10,902,931 B2* | 1/2021 | Han | G09G 3/3266 |
| 2020/0335022 A1* | 10/2020 | Du | G09G 3/20 |
| 2021/0056880 A1* | 2/2021 | Mou | G09G 3/20 |
| 2021/0065601 A1* | 3/2021 | Zheng | G11C 19/28 |

* cited by examiner

SHIFT REGISTER UNIT, DRIVING METHOD, GATE DRIVING CIRCUIT AND DISPLAY PANEL

CROSS-REFERENCE TO RELATED APPLICATION

This application is based upon and claims priority to Chinese Patent Application No. 201911067788.7, filed on Nov. 4, 2019, the entire contents thereof are incorporated herein by reference.

TECHNICAL FIELD

The present disclosure relates to the field of display technology and, in particular, to a shift register unit, a driving method, a gate driving circuit, and a display panel.

BACKGROUND

In the field of display technology, a gate driving circuit is generally used to send gate driving signals to pixel units in a display area row by row, so that the pixel units receive data signals row by row. The gate driving circuit generally includes shift register units coupled in multiple stages, and an output terminal of each shift register unit is coupled to a row of pixel units for sending the above gate driving signal to the pixel units.

In the related art, the shift register unit includes a pull-down circuit that is used to write an invalid signal to a pull-up node and/or an output signal terminal of the shift register unit when the pixel row to which the pull-down circuit corresponds is in a non-scanning state, so that the shift register unit outputs an invalid driving signal.

However, if a transistor in the pull-down circuit is in a long-term biased state, a threshold of the transistor may be shifted. When the threshold of the transistor is shifted, a display panel would display abnormally. For example, when the display panel is turned off, picture flutter is exhibited.

It should be noted that the information disclosed in the above background part is only used to enhance the understanding of the background of the present disclosure and therefore, may include information that does not constitute the prior art known to those of ordinary skill in the art.

SUMMARY

The present disclosure is to provide a shift register unit, a driving method, a gate driving circuit, and a display panel.

Other features and advantages of the present disclosure will become apparent from the following detailed description, or partly obtained through the practice of the present disclosure.

According to an aspect of the present disclosure, there is provided a shift register unit, including: a first signal terminal configured to output high level and low level alternately; a second signal terminal configured to output high level and low level alternately, wherein a level logic of a signal output from the second signal terminal is opposite to the level logic of a signal output from the first signal terminal; a first pull-down control circuit coupled to the second signal terminal, a pull-up node, a first pull-down node, a third signal terminal, and a first pull-down control node, and configured to transmit, in response to a signal of the pull-up node, a signal of the third signal terminal to the first pull-down node and the first pull-down control node and transmit, in response to the signal of the second signal terminal, the signal of the second terminal to the first pull-down node and the first pull-down control node; a second pull-down control circuit coupled to the first signal terminal, the pull-up node, a second pull-down node, the third signal terminal, and a second pull-down control node, and configured to transmit, in response to the signal of the pull-up node, the signal of the third signal terminal to the second pull-down node and the second pull-down control node, and transmit, in response to the signal of the first signal terminal, the signal of the first signal terminal to the second pull-down node and the second pull-down control node; a first pull-down circuit coupled to the first pull-down node, the first signal terminal, and a pull-down target node, and configured to transmit, in response to a signal of the first pull-down node, the signal of the first signal terminal to the pull-down target node; and a second pull-down circuit coupled to the second pull-down node, the second signal terminal, and the pull-down target node, and configured to transmit, in response to a signal of the second pull-down node, the signal of the second signal terminal to the pull-down target node, wherein the pull-down target node includes one or more of the first output terminal, the second output terminal, and the pull-up node.

In an exemplary embodiment of the present disclosure, the pull-down target node includes the first output terminal; the first pull-down circuit includes a first switch unit, including a control terminal coupled to the first pull-down node, a first terminal coupled to the first output terminal, and a second terminal coupled to the first signal terminal; and the second pull-down circuit includes a second switch unit, including a control terminal coupled to the second pull-down node, a first terminal coupled to the first output terminal, and a second terminal coupled to the second signal terminal.

In an exemplary embodiment of the present disclosure, the pull-down target node includes the second output terminal; the first pull-down circuit further includes a third switch unit, including a control terminal coupled to the first pull-down node, a first terminal coupled to the first signal terminal, and a second terminal coupled to the second output terminal; and the second pull-down circuit further includes a fourth switch unit, including a control terminal coupled to the second pull-down node, a first terminal coupled to the second signal terminal, and a second terminal coupled to the second output terminal.

In an exemplary embodiment of the present disclosure, the pull-down target node includes the pull-up node; the first pull-down circuit further includes a fifth switch unit, including a control terminal coupled to the first pull-down node, a first terminal coupled to the first signal terminal, and a second terminal coupled to the pull-up node; and the second pull-down circuit further includes a sixth switch unit, including a control terminal coupled to the second pull-down node, a first terminal coupled to the second signal terminal, and a second terminal coupled to the pull-up node.

In an exemplary embodiment of the present disclosure, the shift register unit further includes: an input circuit coupled to the pull-up node and an signal input terminal, and configured to transmit, in response to a signal of the signal input terminal, the signal of the signal input terminal to the pull-up node; a first output circuit coupled to the pull-up node, a clock signal terminal, and the first output terminal, and configured to transmit, in response to the signal of the pull-up node, a signal of the clock signal terminal to the first output terminal; a second output circuit coupled to the pull-up node, the clock signal terminal, and the second output terminal, and configured to transmit, in response to the signal of the pull-up node, the signal of the clock signal terminal to the second output terminal; a first reset circuit coupled to the third signal terminal, a first reset signal terminal, and the pull-up node, and configured to transmit, in response to a signal of the first reset signal terminal, the signal of the third signal terminal to the pull-up node; and a second reset circuit coupled to the third signal terminal, a second reset signal terminal, and the pull-up node, and configured to transmit, in response to a signal of the second reset signal terminal, the signal of the third signal terminal to the pull-up node.

In an exemplary embodiment of the present disclosure, the first pull-down control circuit includes: a seventh switch unit including a control terminal coupled to the second signal terminal, a first terminal coupled to the second signal terminal, and a second terminal coupled to the first pull-down control node; an eighth switch unit including a control terminal coupled to the first pull-down control node, a first terminal coupled to the second signal terminal, and a second terminal coupled to the first pull-down node; a ninth switch unit, including a control terminal coupled to the pull-up node, a first terminal coupled to the third signal terminal, and a second terminal coupled to the first pull-down control node; and a tenth switch unit including a control terminal coupled to the pull-up node, a first terminal coupled to the third signal terminal, and a second terminal coupled to the first pull-down node.

In an exemplary embodiment of the present disclosure, the second pull-down control unit includes: an eleventh switch unit including a control terminal coupled to the first signal terminal, a first terminal coupled to the first signal terminal, and a second terminal coupled to the second pull-down control node; a twelfth switch unit, including a control terminal coupled to the second pull-down control node, a first terminal coupled to the first signal terminal, and a second terminal coupled to the second pull-down node; a thirteenth switch unit, including a control terminal coupled to the pull-up node, a first terminal coupled to the third signal terminal, and a second terminal coupled to the second pull-down control node; and a fourteenth switch unit, including a control terminal coupled to the pull-up node, a first terminal coupled to the third signal terminal, and a second terminal coupled to the second pull-down node.

In an exemplary embodiment of the present disclosure, the input circuit includes a fifteenth switch unit, including a control terminal coupled to the signal input terminal, a first terminal coupled to the signal input terminal, and a second terminal coupled to the pull-up node. The first output circuit includes: a sixteenth switch unit, including a control terminal coupled to the pull-up node, a first terminal coupled to the clock signal terminal, and a second terminal coupled to the first output terminal; and a capacitor coupled between the pull-up node and the first output terminal. The second output circuit includes a seventeenth switch unit, including a control terminal coupled to the pull-up node, a first terminal coupled to the clock signal terminal and a second terminal coupled to the second signal output terminal. The first reset circuit includes an eighteenth switch unit, including a control terminal coupled to the first reset signal terminal, a first terminal coupled to the third signal terminal and a second terminal coupled to the pull-up node, the second reset circuit includes a nineteenth switch unit, including a control terminal coupled to the second reset signal terminal, a first terminal coupled to the third signal terminal, and a second terminal coupled to the pull-up node.

In an exemplary embodiment of the present disclosure, durations of the high level and the low level output alternately from the first signal terminal and the second signal terminal are same.

According to an aspect of the present disclosure, there is provided a shift register unit driving method for driving the shift register unit described above. The shift register unit is applied to a display panel, and the driving method includes: in a display state of the display panel, alternatively outputting a high level and a low level from the first signal terminal, and alternatively outputting a high level and a low level from the second signal terminal, wherein a level logic of a signal output from the second signal terminal is opposite to the level logic of a signal output from the first signal terminal.

According to an aspect of the present disclosure, there is provided a gate driving circuit, including a plurality of cascaded shift register units described above.

According to an aspect of the present disclosure, there is provided a display panel, including the gate driving circuit described above.

It should be noted that the above general description and the following detailed description are merely exemplary and explanatory and should not be construed as limiting of the present disclosure.

BRIEF DESCRIPTION OF THE DRAWINGS

The drawings herein are incorporated into and constitute a part of the specification, show embodiments consistent with the present disclosure, and are used to explain the principles of the present disclosure together with the specification. Understandably, the drawings in the following description are only some embodiments of the present disclosure. Those of ordinary skill in the art may obtain other drawings based on these drawings without paying any creative labor.

DETAILED DESCRIPTION

Figure 1:
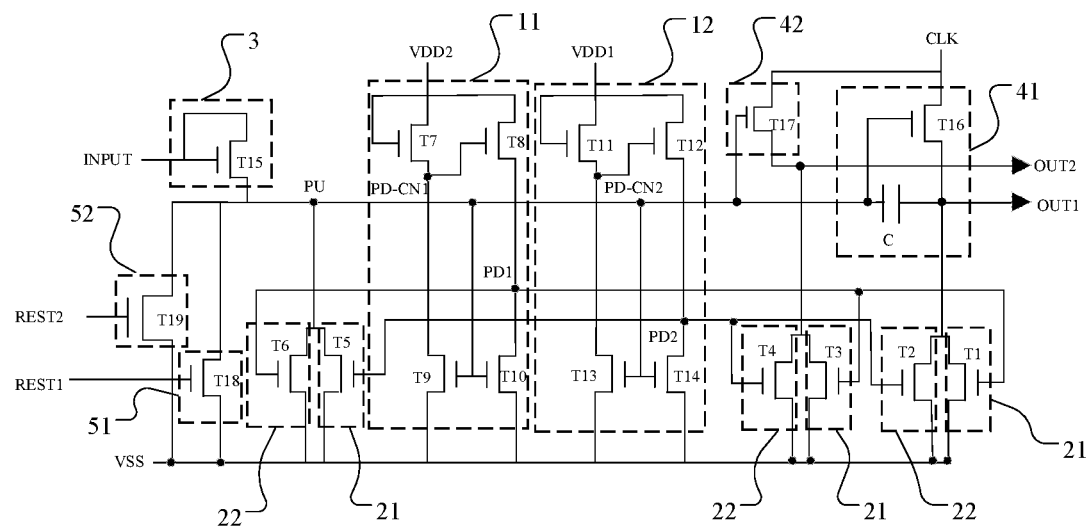
FIG. 1 is a schematic structural diagram of a shift register unit in the related art.

Example embodiments will now be described more fully with reference to the drawings. However, the example embodiments may be implemented in various forms and should not be construed as being limited to the examples set forth herein. Rather, embodiments are provided so that the present disclosure is more comprehensive and complete, and fully conveys the concept of the example embodiments to those skilled in the art. Same reference numerals in the drawings denote same or similar structures, and thus their detailed description will be omitted.

Although in the specification relative terms such as "upper" and "lower" are used to describe the relative relationship between one component and another component shown, these terms used in the specification are only for convenience of description, for example, according to example directions shown in the drawings. It can be understood that if a device as shown is turned upside down, then a component described as "upper" will become the component as "lower." Other relative terms such as "high," "low," "top," "bottom," "left," "right," and the like have similar meanings. When a structure is "on" another structure, it may mean that the structure is integrally formed on the other structure, or that the structure is disposed "directly" on the other structure, or that the structure is disposed "indirectly" on the other structure through another structure.

The terms "a," "an," and "said" are used to indicate the presence of one or more elements, components, etc. The terms "include" and "have" are used to indicate an open-ended inclusion and that there may be additional elements, components, etc. in addition to the listed elements, components, etc.

Referring to FIG. 1, a schematic structural diagram of a shift register unit in the related art is shown. The shift register unit includes an input circuit 3, a first pull-down control circuit 11, a second pull-down control circuit 12, a first pull-down circuit 21, a second pull-down circuit 22, a first output circuit 41, a second output circuit 42, a first reset circuit 51, and a second reset circuit 52. The first pull-down control circuit 11 and the second pull-down control circuit 12 operate alternately. The operation of the shift register unit includes four stages: a signal input stage, a signal output stage, a pull-down stage, and a reset stage. The present disclosure takes the operation of the first pull-down control circuit 11 as an example. In the signal input stage, the input circuit 3 transmits a signal of a signal input terminal INPUT to a pull-up node. In the signal output stage, the first output circuit 41 transmits a signal of a clock signal terminal CLK to a first output terminal OUT1, and the second output circuit 42 transmits the signal of the clock signal terminal CLK to a second output terminal OUT2, meanwhile the first pull-down control circuit 11 transmits, under the control of the pull-up node PU, a signal of a third signal terminal VSS to a first pull-down control node DP-CN1 and a first pull-down node PD1. In the pull-down stage, the first pull-down control circuit 11 transmits a signal of a second signal terminal VDD2 to a first pull-down node PD1, and the first pull-down circuit 21 transmits, under the control of the first pull-down node, the signal of the third signal terminal VSS to the first output terminal OUT1, the second output terminal OUT2, and the pull-up node PU to de-noise the first output terminal OUT1, the second output terminal OUT2, and the pull-up node PU. Further, in the reset stage, the first reset circuit 51 is turned on under the control of the first reset signal terminal RESET1 to transmit the signal of the third signal terminal VSS to the pull-up node PU, and the second reset circuit 52 may reset the pull-up node PU before and after a frame. Similarly, when the second pull-down control circuit 12 operates, a driving method of the shift register unit is as described above.

Figure 2:
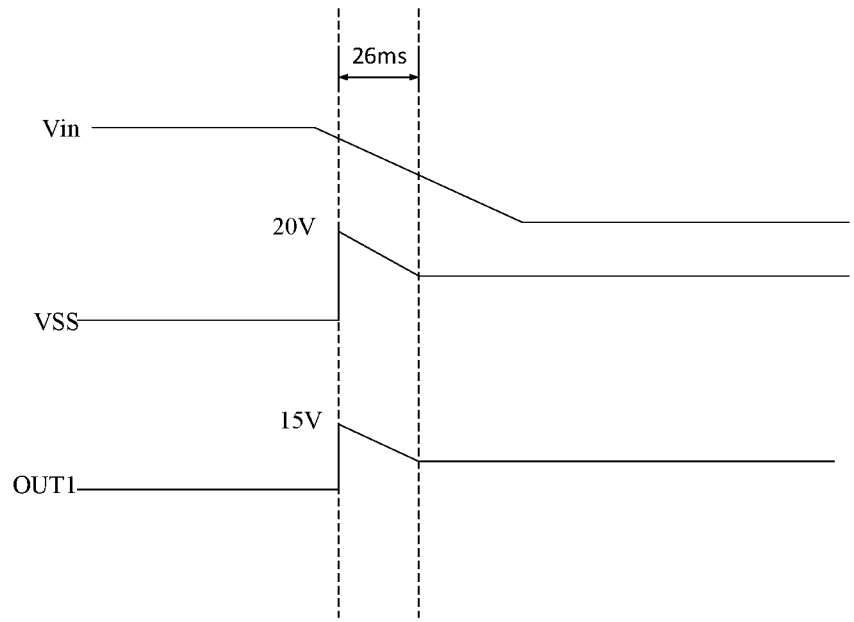
FIG. 2 is a timing diagram of each signal terminal when a display panel is turned off before a threshold of a transistor is shifted.
Figure 3:
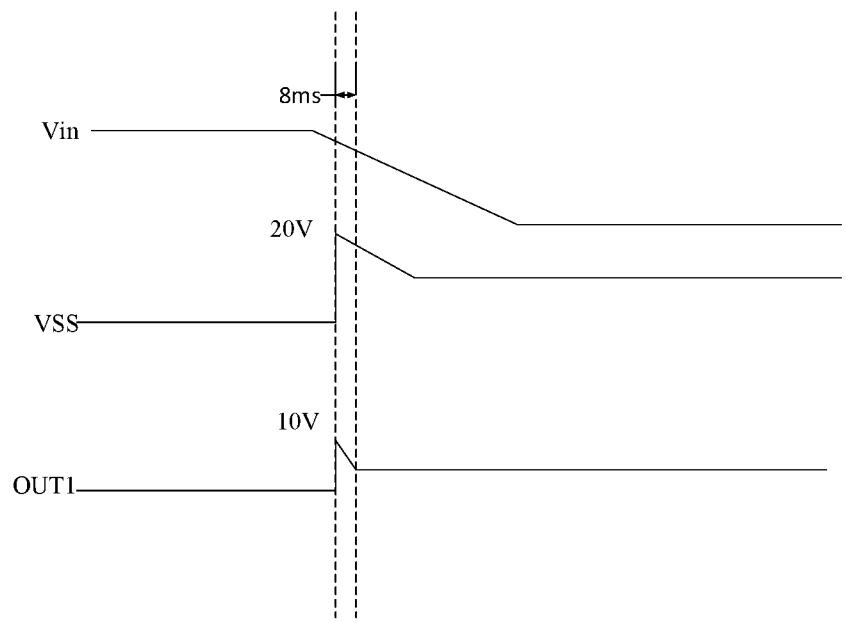
FIG. 3 is a timing diagram of each signal terminal when a display panel is turned off after a threshold of a transistor is shifted.

In the related art, as shown in FIG. 1, the first pull-down circuit 21 may include switch units T1, T3, and T5, the second pull-down circuit 22 includes switch units T2, T4, and T6, and the switch units T1, T3, T5, T2, T4, and T6 may be switching transistors. Since the switch units T1, T3, T5, T2, T4, and T6 are in a long-term biased state, thresholds of the switch units T1, T3, T5, T2, T4, and T6 may be shifted, resulting in abnormal display of a display panel. For example, referring to FIG. 2, a timing diagram of each signal terminal when the display panel is turned off before the threshold of the transistor is shifted is shown. Vin is a power signal of the display panel, VSS is a signal of the third signal terminal VSS of the shift register unit, and OUT1 is a signal of the first output terminal OUT1 of the shift register unit. When the display panel is turned off, an active level is written to the third signal terminal VSS (herein, by taking that a high level is used as the active level as an example) so as to input the active level to the first output terminal OUT1 through the switch unit T1 or T2, and then discharge electric charges in the display panel to avoid picture flutter of the display panel. As shown in FIG. 2, before the threshold of the switch unit is shifted, when the display panel is turned off, the active level written to the third signal terminal VSS may be 20V, the active level written to the first signal output terminal OUT1 through the third signal terminal VSS may be 15V, and the duration of the active level of the first signal output terminal OUT1 may be 26 ms. Referring to FIG. 3, a timing diagram of each signal terminal when the display panel is turned off after the threshold of the transistor is shifted is shown. Vin is the power signal of the display panel, VSS is the signal of the third signal terminal VSS of the shift register unit, and OUT1 is the signal of the first output terminal OUT1 of the shift register unit. As shown in FIG. 3, after the threshold of the switch unit is shifted, when the display panel is turned off, the active level written to the third signal terminal VSS may be 20V, the active level written to the first signal output terminal OUT1 through the third signal terminal VSS is only 10V since the thresholds of the switch units T1 and T2 are shifted, and the duration of the active level of the first signal output terminal OUT1 is only 8 ms. Therefore, after the thresholds of the switch units T1, T3, T5, T2, T4, and T6 are shifted, the electric charges in the display panel cannot be effectively discharged, thereby causing picture flutter of the display panel. In addition, the threshold shifts of the switch units T1, T3, T5, T2, T4, and T6 may also cause the first output terminal OUT1, the second output terminal OUT2, and the pull-up node PU to be de-noised poorly in pull-down stage, resulting in abnormal display.

Figure 4:
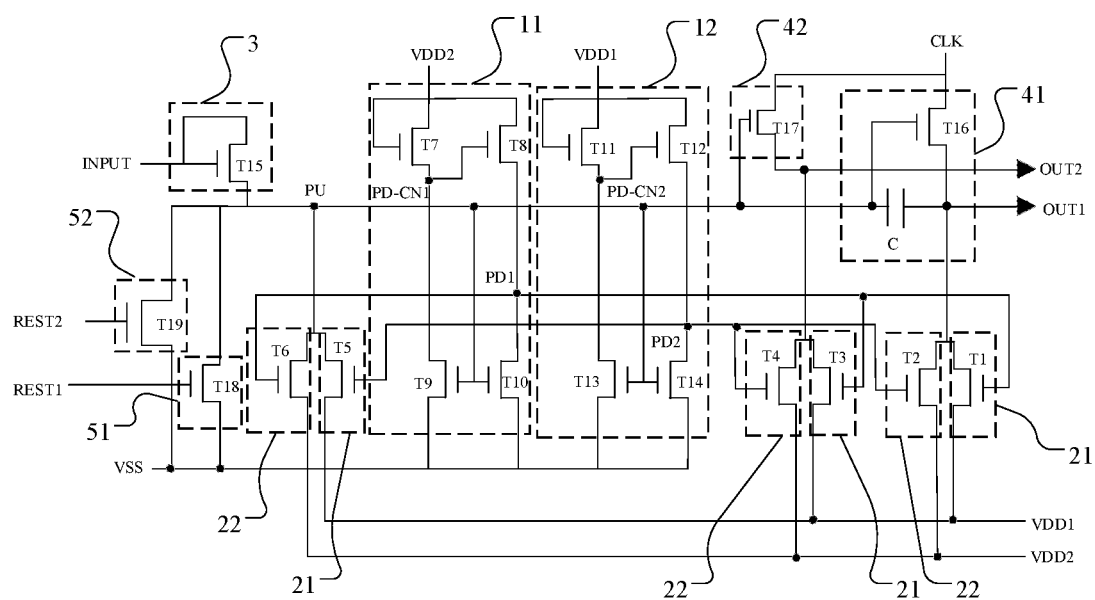
FIG. 4 is a schematic structural diagram of a shift register unit according to an exemplary embodiment of the present disclosure.

In view of the above, an exemplary embodiment firstly provides a shift register unit. Referring to FIG. 4, a schematic structural diagram of a shift register unit according to an exemplary embodiment of the present disclosure is shown. The shift register unit includes a first signal terminal VDD1, a second signal terminal VDD2, a first pull-down control circuit 11, a second pull-down control circuit 12, a first pull-down circuit 21, and a second pull-down circuit 22. The first signal terminal VDD1 is configured to output high level and low level alternately. The second signal terminal VDD2 is configured to output high level and low level alternately, and a level logic of a signal output from the second signal terminal VDD2 is opposite to the level logic of a signal output from the first signal terminal VDD1. The first pull-down control circuit 11 is coupled to the second signal terminal VDD2, a pull-up node PU, a first pull-down node PD1, a third signal terminal VSS, and a first pull-down control node PD-CN1, and is configured to transmit, in response to a signal of the pull-up node PU, a signal of the third signal terminal VSS to the first pull-down node PD1 and the first pull-down control node PD-CN1, and transmit, in response to the signal of the second signal terminal VDD2, the signal of the second terminal VDD2 to the first pull-down node PD1 and the first pull-down control node PD-CN1. The second pull-down control circuit 12 is coupled to the first signal terminal VDD1, the pull-up node PU, a second pull-down node PD2, the third signal terminal VSS, and a second pull-down control node PD-CN2, and is configured to transmit, in response to the signal of the pull-up node PU, the signal of the third signal terminal VSS to the second pull-down node PD2 and the second pull-down control node PD-CN2, and transmit, in response to the signal of the first signal terminal VDD1, the signal of the first signal terminal VDD1 to the second pull-down node PD2, and the second pull-down control node PD-CN2. The first pull-down circuit 21 is coupled to the first pull-down node PD1, the first signal terminal VDD1, and a pull-down target node, and is configured to transmit, in response to a signal of the first pull-down node PD1, the signal of the first signal terminal VDD1 to the pull-down target node. Also, the second pull-down circuit 22 is coupled to the second pull-down node PD2, the second signal terminal VDD2, and the pull-down target node, and is configured to transmit, in response to a signal of the second pull-down node PD2, the signal of the second signal terminal VDD2 to the pull-down target node. The pull-down target node includes one or more of the first output terminal OUT1, the second output terminal OUT2, and the pull-up node PU.

In the shift register unit provided by the present disclosure, the first pull-down control circuit and the second pull-down control circuit operate alternately. When the first signal terminal is at an active level, the second signal terminal is at an inactive level, the first pull-down node is at an inactive level, the second pull-down node is at an active level, and the second pull-down circuit is in an operating state. At this time, a gate of a transistor in the second pull-down circuit is at an active level and a source thereof is at an inactive level, and the transistor in the second pull-down circuit is shifted positively. Meanwhile, a gate of a transistor in the first pull-down circuit is at an inactive level, a source thereof is at an active level, and the transistor in the first pull-down circuit is shifted negatively. When the first signal terminal is at an inactive level, the second signal terminal is at an active level, the first pull-down node is at an active level, the second pull-down node is at an inactive level, and the first pull-down circuit is in an operating state. At this time, the gate of the transistor in the first pull-down circuit is at an active level, the source thereof is at an inactive level, and the transistor in the first pull-down circuit is shifted positively. Meanwhile, the gate of the transistor in the second pull-down circuit is at an active level, the source thereof is at an inactive level, and the transistor in the second pull-down circuit is shifted negatively. The transistors in the first pull-down circuit and the second pull-down circuit have different threshold-shifting directions when the first pull-down control circuit and the second pull-down control circuit operate alternately, so that the threshold shifts of the transistors of the first pull-down circuit and the second pull-down circuit are neutralized, and eventually no threshold shift occurs.

In an exemplary embodiment of the present disclosure, as shown in FIG. 4, the pull-down target node may include the first output terminal OUT1. The first pull-down circuit 21 may include a first switch unit T1, including a control terminal coupled to the first pull-down node PD1, a first terminal coupled to the first output terminal OUT1, and a second terminal coupled to the first signal terminal VDD1. Also, the second pull-down circuit 22 may include a second switch unit T2, including a control terminal coupled to the second pull-down node PD2, a first terminal coupled to the first output terminal OUT1, and a second terminal coupled to the second signal terminal VDD2.

In an exemplary embodiment of the present disclosure, the pull-down target node may further include the second output terminal OUT2. The first pull-down circuit 21 may further include a third switch unit T3, including a control terminal coupled to the first pull-down node PD1, a first terminal coupled to the first signal terminal VDD1, and a second terminal coupled to the second output terminal VDD2. Also, the second pull-down circuit 22 may further include a fourth switch unit T4, including a control terminal coupled to the second pull-down node PD2, a first terminal coupled to the second signal terminal VDD2, and a second terminal coupled to the second output terminal OUT2.

In an exemplary embodiment of the present disclosure, as shown in FIG. 4, the pull-down target node may further include the pull-up node PU. The first pull-down circuit 21 may further include a fifth switch unit T5, including a control terminal coupled to the first pull-down node PD1, a first terminal coupled to the first signal terminal VDD1, and a second terminal coupled to the pull-up node PU. Also, the second pull-down circuit 22 may further include a sixth switch unit T6, including a control terminal coupled to the second pull-down node PD2, a first terminal coupled to the second signal terminal VDD2, and a second terminal coupled to the pull-up node PU.

In an exemplary embodiment of the present disclosure, as shown in FIG. 4, the shift register unit may further includes an input circuit 3, a first output circuit 41, a second output circuit 42, a first reset circuit 51, and a second reset circuit 52. The input circuit 3 is coupled to the pull-up node PU and an signal input terminal INPUT, and is configured to transmit, in response to a signal of the signal input terminal INPUT, the signal of the signal input terminal INPUT to the pull-up node PU. The first output circuit 41 is coupled to the pull-up node PU, a clock signal terminal CKL, and the first output terminal OUT1, and is configured to transmit, in response to the signal of the pull-up node PU, a signal of the clock signal terminal CKL to the first output terminal OUT1. The second output circuit 42 is coupled to the pull-up node PU, the clock signal terminal CKL, and the second output terminal OUT2, and is configured to transmit, in response to the signal of the pull-up node PU, the signal of the clock signal terminal CKL to the second output terminal OUT2. The first reset circuit 51 is coupled to the third signal terminal VSS, a first reset signal terminal RESET1, and the pull-up node PU, and is configured to transmit, in response to a signal of the first reset signal terminal RESET1, the signal of the third signal terminal VSS to the pull-up node PU. Also, the second reset circuit 52 is coupled to the third signal terminal VSS, a second reset signal terminal RESET2, and the pull-up node PU, and is configured to transmit, in response to a signal of the second reset signal terminal RESET2, the signal of the third signal terminal VSS to the pull-up node PU.

In an exemplary embodiment of the present disclosure, as shown in FIG. 4, the first pull-down control circuit 11 may include a seventh switch unit T7, an eighth switch unit T8, a ninth switch unit T9, and a tenth switch unit T10. The seventh switch unit T7 includes a control terminal coupled to the second signal terminal VDD2, a first terminal coupled to the second signal terminal VDD2, and a second terminal coupled to the first pull-down control node PD-CN1. The eighth switch unit T8 includes a control terminal coupled to the first pull-down control node PD-CN1, a first terminal coupled to the second signal terminal VDD2, and a second terminal coupled to the first pull-down node PD1. The ninth switch unit T9 includes a control terminal coupled to the pull-up node PU, a first terminal coupled to the third signal terminal VSS, and a second terminal coupled to the first pull-down control node PD-CN1. Also, the tenth switch unit T10 includes a control terminal coupled to the pull-up node PU, a first terminal coupled to the third signal terminal VSS, and a second terminal coupled to the first pull-down node PD1.

In an exemplary embodiment of the present disclosure, as shown in FIG. 4, the second pull-down control unit 12 may include an eleventh switch unit T11, a twelfth switch unit T12, a thirteenth switch unit T13, and a fourteenth switch unit T14. The eleventh switch unit T11 includes a control terminal coupled to the first signal terminal VDD1, a first terminal coupled to the first signal terminal VDD1, and a second terminal coupled to the second pull-down control node PD-CN2. The twelfth switch unit T12 includes a control terminal coupled to the second pull-down control node PD-CN2, a first terminal coupled to the first signal terminal VDD1, and a second terminal coupled to the second pull-down node PD2. The thirteenth switch unit T13 includes a control terminal coupled to the pull-up node PU, a first terminal coupled to the third signal terminal VSS, and a second terminal coupled to the second pull-down control node PD-CN2. Also, the fourteenth switch unit T14 includes a control terminal coupled to the pull-up node PU, a first terminal coupled to the third signal terminal VSS, and a second terminal coupled to the second pull-down node PD2.

In an exemplary embodiment of the present disclosure, as shown in FIG. 4, the input circuit 3 may include a fifteenth switch unit T15, including a control terminal coupled to the signal input terminal INPUT, a first terminal coupled to the signal input terminal INPUT, and a second terminal coupled to the pull-up node PU. The first output circuit 41 may include: a sixteenth switch unit T16, including a control terminal coupled to the pull-up node PU, a first terminal coupled to the clock signal terminal CLK, and a second terminal coupled to the first output terminal OUT1; and a capacitor C, coupled between the pull-up node PU and the first output terminal OUT1. The second output circuit 42 may include a seventeenth switch unit T17, including a control terminal coupled to the pull-up node PU, a first terminal coupled to the clock signal terminal CLK, and a second terminal coupled to the second signal output terminal OUT2. The first reset circuit 51 may include an eighteenth switch unit T18, including a control terminal coupled to the first reset signal terminal RESET1, a first terminal coupled to the third signal terminal VSS, and a second terminal coupled to the pull-up node PU. The second reset circuit 52 may include a nineteenth switch unit T19, including a control terminal coupled to the second reset signal terminal RESET2, a first terminal coupled to the third signal terminal VSS, and a second terminal coupled to the pull-up node PU.

As shown in FIG. 4, the first switch unit T1 to the nineteenth switch unit T19 may be switching transistors. The first switch unit T1 to the nineteenth switch unit T19 may be N-type switching transistors or P-type switching transistors. In the following exemplary embodiments, a driving method of the register shift unit will be described by taking that the first switch unit T1 to the nineteenth switch unit T19 are the N-type switching transistors as an example.

Figure 5:
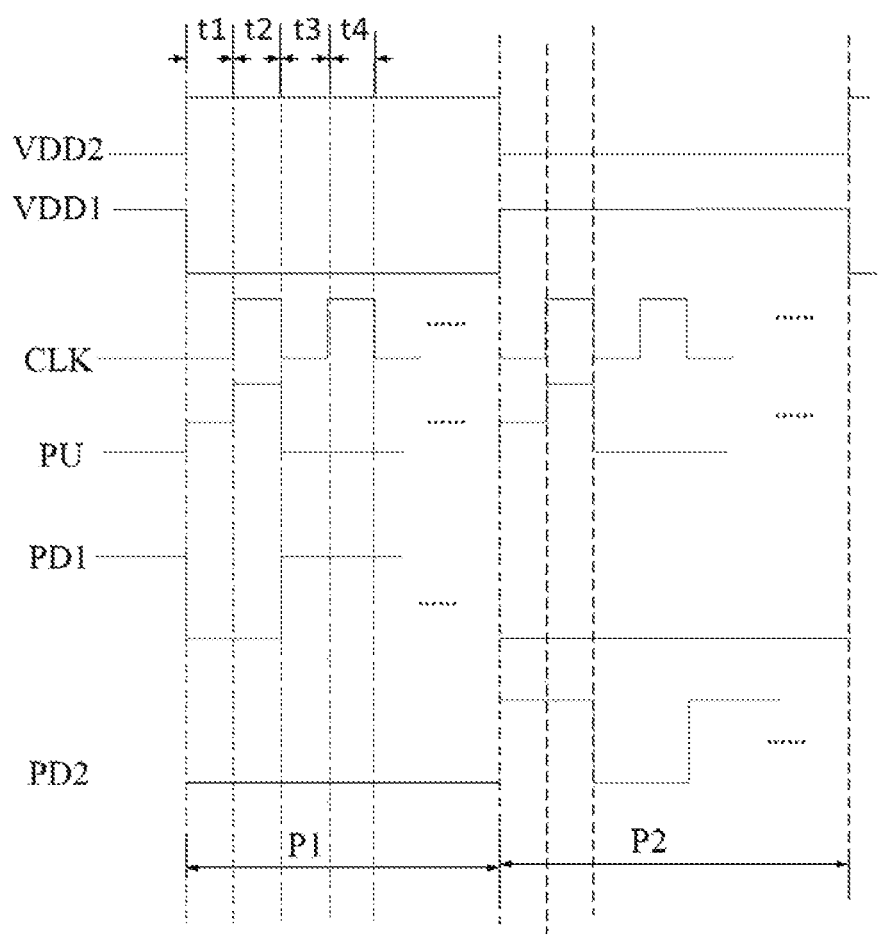
FIG. 5 is a timing diagram of each node of a shift register unit according to an exemplary embodiment of the present disclosure.

As shown in FIG. 5, a timing diagram of each node of the shift register unit according to an exemplary embodiment of the present disclosure. As shown in FIG. 5, the first signal terminal VDD1 alternately outputs high level and low level, the second signal terminal VDD2 alternately outputs high level and low level, and a level logic of the output signal of the second signal terminal VDD2 is opposite to that of the first signal terminal VDD1. In a P1 period, the first signal terminal VDD1 outputs a low-level signal and the second signal terminal VDD2 outputs a high-level signal. At this time, the first pull-down control circuit 11 is in an operating state, and the driving method of the shift register unit may include four stages: a signal input stage t1, a signal output stage t2, a pull-down stage t3, and a reset stage t4. In the signal input stage t1, the input signal terminal INPUT is at a high level, the fifteenth switch unit is turned on under the high level of the input signal terminal INPUT to transmit the high level of the input signal terminal INPUT to the pull-up node PU and charge the capacitor C. Meanwhile, the tenth switch unit T10 is turned on under the control of the pull-up node PU to transmit the low-level signal of the third signal terminal VSS to the first pull-down node PD1, and the ninth switch unit is turned on under the control of the pull-up node PU to transmit the low-level signal of the third signal terminal VSS to the first pull-down control node PD-CN1. In the signal output stage t2, the clock signal terminal CLK is of a high-level signal, the sixteenth switch unit and the seventeenth switch unit are turned on under the high level of the pull-up node PU to transmit the high level signal of the clock signal terminal CLK to the first output terminal OUT1 and the second output terminal OUT2. In the pull-down stage t3, the clock signal terminal CLK is at a low level, and the seventh transistor T7 and the eighth transistor T8 are turned on to transmit the high level signal of the second signal terminal VDD2 to the first pull-down control node PD-CN1, the first pull-down node PD1, the first switch unit T1 is turned on under the control of the first pull-down node PD1 to transmit the low-level signal of the first signal terminal VDD1 to the first output terminal OUT1, the third switch unit T3 is turned on under the control of the first pull-down node PD1 to transmit the low-level signal of the first signal terminal VDD1 to the second output terminal OUT2, and the fifth switch unit T5 is turned on under the control of the first pull-down node PD1 to transmit the low-level signal of the first signal terminal VDD1 to the pull-up node PU. In the reset stage, the first reset signal terminal RESET1 is at a high level, and the eighteenth switch unit is turned on under the high level of the first reset signal terminal to transmit the low-level signal of the third signal terminal VSS to the pull-up node PU. The second reset circuit 52 may be used to reset the pull-up node PU before and after a frame.

It can be determined from the above-described driving method that, during a frame scanning of the P1 period, the first pull-down node PD1 is at a high level in other stages than the signal input stage t1 and the signal output stage t2 of the row scanning thereof. Since the sources of the first switch unit T1, the third switch unit T3, and the fifth switch unit T5 are coupled to the first signal terminal VDD1, the gates thereof are coupled to the first pull-down node PD1, the first pull-down node PD1 is at a high level for a long time, and the first signal terminal VDD1 is at a low level, and the thresholds of the first switch unit T1, the third switch unit T3, and the fifth switch unit T5 are shifted positively. At the same time, since the sources of the second switch unit T2, the fourth switch unit T4, and the sixth switch unit T6 are coupled to the second signal terminal VDD2, the gates thereof are coupled to the second pull-down node PD2, the second pull-down node PD2 is at a low level, and the second signal terminal VDD2 is at a high level, and the thresholds of the second switch unit T2, the fourth switch unit T4 and the sixth switch unit T6 are shifted negatively. Similarly, in the P2 period, the thresholds of the first switch unit T1, the third switch unit T3 and the fifth switch unit T5 are shifted negatively, and the thresholds of the second switch unit T2, the fourth switch unit T4, and the sixth switch unit T6 are shifted positively. Since the shifting directions of the first to sixth switch units are different in different periods, the threshold shifts of the first to sixth switch units are neutralized, and eventually no threshold shift occurs.

In an exemplary embodiment of the present disclosure, durations P1 and P2 of the high level and the low level output alternately from the first signal terminal and the second signal terminal are same, for example, P1 and P2 may be 2-3 s.

An exemplary embodiment of the present disclosure further provides a shift register unit driving method for driving the above-described shift register unit. The shift register unit is applied to a display panel, and the driving method includes: in a display state of the display panel, alternatively outputting a high level and a low level from the first signal terminal, and alternatively outputting a high level and a low level from the second signal terminal. A level logic of a signal output from the second signal terminal is opposite to the level logic of a signal output from the first signal terminal.

An exemplary embodiment of the present disclosure further provides a gate driving circuit, including a plurality of the above-described shift register units, which are cascaded.

An exemplary embodiment of the present disclosure further provides a display panel including the above-described gate driving circuit. The display panel may be applied to a display device such as a mobile phone, a tablet, a TV, and the like.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and comprise common knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes may be made without departing from the scope thereof. The scope of the present disclosure is limited only by the appended claims.

What is claimed is:

1. A shift register unit, comprising:
   a first signal terminal configured to output high level and low level alternately;
   a second signal terminal configured to output high level and low level alternately, wherein a level logic of a signal output from the second signal terminal is opposite to the level logic of a signal output from the first signal terminal;
   a first pull-down control circuit coupled to the second signal terminal, a pull-up node, a first pull-down node, a third signal terminal, and a first pull-down control node, and configured to transmit, in response to a signal of the pull-up node, a signal of the third signal terminal to the first pull-down node and the first pull-down control node, and transmit, in response to the signal of the second signal terminal, the signal of the second terminal to the first pull-down node and the first pull-down control node;
   a second pull-down control circuit coupled to the first signal terminal, the pull-up node, a second pull-down node, the third signal terminal, and a second pull-down control node, and configured to transmit, in response to the signal of the pull-up node, the signal of the third signal terminal to the second pull-down node and the second pull-down control node, and transmit, in response to the signal of the first signal terminal, the signal of the first signal terminal to the second pull-down node and the second pull-down control node;
   a first pull-down circuit coupled to the first pull-down node, the first signal terminal, and a pull-down target node, and configured to transmit, in response to a signal of the first pull-down node, the signal of the first signal terminal to the pull-down target node; and
   a second pull-down circuit coupled to the second pull-down node, the second signal terminal, and the pull-down target node, and configured to transmit, in response to a signal of the second pull-down node, the signal of the second signal terminal to the pull-down target node;
   wherein the pull-down target node comprises one or more of the first output terminal, the second output terminal and the pull-up node.

2. The shift register unit according to claim 1, wherein:
   the pull-down target node comprises the first output terminal;
   the first pull-down circuit comprises a first switch unit comprising a control terminal coupled to the first pull-down node, a first terminal coupled to the first output terminal, and a second terminal coupled to the first signal terminal; and
   the second pull-down circuit comprises a second switch unit comprising a control terminal coupled to the second pull-down node, a first terminal coupled to the first output terminal, and a second terminal coupled to the second signal terminal.

3. The shift register unit according to claim 1, wherein:
   the pull-down target node comprises the second output terminal;
   the first pull-down circuit comprises a third switch unit comprising a control terminal coupled to the first pull-down node, a first terminal coupled to the first signal terminal, and a second terminal coupled to the second output terminal; and
   the second pull-down circuit comprises a fourth switch unit comprising a control terminal coupled to the second pull-down node, a first terminal coupled to the second signal terminal, and a second terminal coupled to the second output terminal.

4. The shift register unit according to claim 1, wherein:
   the pull-down target node comprises the pull-up node;
   the first pull-down circuit comprises a fifth switch unit comprising a control terminal coupled to the first pull-down node, a first terminal coupled to the first signal terminal, and a second terminal coupled to the pull-up node; and
   the second pull-down circuit comprises a sixth switch unit comprising a control terminal coupled to the second pull-down node, a first terminal coupled to the second signal terminal, and a second terminal coupled to the pull-up node.

5. The shift register unit according to claim 1, further comprising:
   an input circuit coupled to the pull-up node and an signal input terminal, and configured to transmit, in response to a signal of the signal input terminal, the signal of the signal input terminal to the pull-up node;
   a first output circuit coupled to the pull-up node, a clock signal terminal, and the first output terminal, and configured to transmit, in response to the signal of the pull-up node, a signal of the clock signal terminal to the first output terminal;
a second output circuit coupled to the pull-up node, the clock signal terminal, and the second output terminal, and configured to transmit, in response to the signal of the pull-up node, the signal of the clock signal terminal to the second output terminal;
a first reset circuit coupled to the third signal terminal, a first reset signal terminal, and the pull-up node, and configured to transmit, in response to a signal of the first reset signal terminal, the signal of the third signal terminal to the pull-up node; and
a second reset circuit coupled to the third signal terminal, a second reset signal terminal, and the pull-up node, and configured to transmit, in response to a signal of the second reset signal terminal, the signal of the third signal terminal to the pull-up node.

6. The shift register unit according to claim 1, wherein the first pull-down control circuit comprises:
a seventh switch unit comprising a control terminal coupled to the second signal terminal, a first terminal coupled to the second signal terminal, and a second terminal coupled to the first pull-down control node;
an eighth switch unit comprising a control terminal coupled to the first pull-down control node, a first terminal coupled to the second signal terminal, and a second terminal coupled to the first pull-down node;
a ninth switch unit comprising a control terminal coupled to the pull-up node, a first terminal coupled to the third signal terminal, and a second terminal coupled to the first pull-down control node; and
a tenth switch unit, comprising a control terminal coupled to the pull-up node, a first terminal coupled to the third signal terminal and a second terminal coupled to the first pull-down node.

7. The shift register unit according to claim 1, wherein the second pull-down control unit comprises:
an eleventh switch unit comprising a control terminal coupled to the first signal terminal, a first terminal coupled to the first signal terminal, and a second terminal coupled to the second pull-down control node;
a twelfth switch unit comprising a control terminal coupled to the second pull-down control node, a first terminal coupled to the first signal terminal, and a second terminal coupled to the second pull-down node;
a thirteenth switch unit comprising a control terminal coupled to the pull-up node, a first terminal coupled to the third signal terminal, and a second terminal coupled to the second pull-down control node; and
a fourteenth switch unit comprising a control terminal coupled to the pull-up node, a first terminal coupled to the third signal terminal, and a second terminal coupled to the second pull-down node.

8. The shift register unit according to claim 5, wherein:
the input circuit comprises a fifteenth switch unit comprising a control terminal coupled to the signal input terminal, a first terminal coupled to the signal input terminal, and a second terminal coupled to the pull-up node;
the first output circuit comprises a sixteenth switch unit comprising a control terminal coupled to the pull-up node, a first terminal coupled to the clock signal terminal, and a second terminal coupled to the first output terminal, and a capacitor coupled between the pull-up node and the first output terminal;
the second output circuit comprises: a seventeenth switch unit comprising a control terminal coupled to the pull-up node, a first terminal coupled to the clock signal terminal, and a second terminal coupled to the second signal output terminal,
the first reset circuit comprises: an eighteenth switch unit, comprising a control terminal coupled to the first reset signal terminal, a first terminal coupled to the third signal terminal and a second terminal coupled to the pull-up node; and
the second reset circuit comprises: a nineteenth switch unit, comprising a control terminal coupled to the second reset signal terminal, a first terminal coupled to the third signal terminal and a second terminal coupled to the pull-up node.

9. The shift register unit according to claim 1, wherein durations of the high level and the low level output alternately from the first signal terminal are the same, and durations of the high level and the low level output alternately from the second signal terminal are the same.

10. A driving method for a shift register unit applied to a display panel, comprising:
providing the shift register unit, the shift register unit comprising:
a first signal terminal;
a second signal terminal;
a first pull-down control circuit coupled to the second signal terminal, a pull-up node, a first pull-down node, a third signal terminal, and a first pull-down control node, and configured to transmit, in response to a signal of the pull-up node, a signal of the third signal terminal to the first pull-down node and the first pull-down control node, and transmit, in response to the signal of the second signal terminal, the signal of the second terminal to the first pull-down node and the first pull-down control node;
a second pull-down control circuit coupled to the first signal terminal, the pull-up node, a second pull-down node, the third signal terminal, and a second pull-down control node, and configured to transmit, in response to the signal of the pull-up node, the signal of the third signal terminal to the second pull-down node and the second pull-down control node, and transmit, in response to the signal of the first signal terminal, the signal of the first signal terminal to the second pull-down node and the second pull-down control node;
a first pull-down circuit coupled to the first pull-down node, the first signal terminal and a pull-down target node, and configured to transmit, in response to a signal of the first pull-down node, the signal of the first signal terminal to the pull-down target node; and
a second pull-down circuit coupled to the second pull-down node, the second signal terminal, and the pull-down target node, and configured to transmit, in response to a signal of the second pull-down node, the signal of the second signal terminal to the pull-down target node, wherein the pull-down target node comprises one or more of the first output terminal, the second output terminal, and the pull-up node;
in a display state of the display panel, alternatively outputting a high level and a low level from the first signal terminal, and alternatively outputting a high level and a low level from the second signal terminal, wherein a level logic of a signal output from the second signal terminal is opposite to the level logic of a signal output from the first signal terminal.

11. A gate driving circuit, comprising a plurality of shift register units which are cascaded, wherein the shift register unit comprises:
- a first signal terminal configured to output high level and low level alternately;
- a second signal terminal configured to output high level and low level alternately, wherein a level logic of a signal output from the second signal terminal is opposite to the level logic of a signal output from the first signal terminal;
- a first pull-down control circuit coupled to the second signal terminal, a pull-up node, a first pull-down node, a third signal terminal, and a first pull-down control node, and configured to transmit, in response to a signal of the pull-up node, a signal of the third signal terminal to the first pull-down node and the first pull-down control node, and transmit, in response to the signal of the second signal terminal, the signal of the second terminal to the first pull-down node and the first pull-down control node;
- a second pull-down control circuit coupled to the first signal terminal, the pull-up node, a second pull-down node, the third signal terminal, and a second pull-down control node, and configured to transmit, in response to the signal of the pull-up node, the signal of the third signal terminal to the second pull-down node and the second pull-down control node, and transmit, in response to the signal of the first signal terminal, the signal of the first signal terminal to the second pull-down node and the second pull-down control node;
- a first pull-down circuit coupled to the first pull-down node, the first signal terminal, and a pull-down target node, and configured to transmit, in response to a signal of the first pull-down node, the signal of the first signal terminal to the pull-down target node; and
- a second pull-down circuit coupled to the second pull-down node, the second signal terminal, and the pull-down target node, and configured to transmit, in response to a signal of the second pull-down node, the signal of the second signal terminal to the pull-down target node, wherein the pull-down target node comprises one or more of the first output terminal, the second output terminal, and the pull-up node.

12. The gate driving circuit according to claim 11, wherein:
- the pull-down target node comprises the first output terminal;
- the first pull-down circuit comprises: a first switch unit comprising a control terminal coupled to the first pull-down node, a first terminal coupled to the first output terminal, and a second terminal coupled to the first signal terminal; and
- the second pull-down circuit comprises: a second switch unit comprising a control terminal coupled to the second pull-down node, a first terminal coupled to the first output terminal, and a second terminal coupled to the second signal terminal.

13. The gate driving circuit according to claim 11, wherein:
- the pull-down target node comprises the second output terminal;
- the first pull-down circuit comprises: a third switch unit comprising a control terminal coupled to the first pull-down node, a first terminal coupled to the first signal terminal, and a second terminal coupled to the second output terminal; and
- the second pull-down circuit comprises: a fourth switch unit comprising a control terminal coupled to the second pull-down node, a first terminal coupled to the second signal terminal, and a second terminal coupled to the second output terminal.

14. The gate driving circuit according to claim 11, wherein:
- the pull-down target node comprises the pull-up node;
- the first pull-down circuit comprises: a fifth switch unit comprising a control terminal coupled to the first pull-down node, a first terminal coupled to the first signal terminal, and a second terminal coupled to the pull-up node; and
- the second pull-down circuit comprises: a sixth switch unit comprising a control terminal coupled to the second pull-down node, a first terminal coupled to the second signal terminal, and a second terminal coupled to the pull-up node.

15. The gate driving circuit according to claim 11, wherein the shift register unit further comprises:
- an input circuit coupled to the pull-up node and an signal input terminal, and configured to transmit, in response to a signal of the signal input terminal, the signal of the signal input terminal to the pull-up node;
- a first output circuit coupled to the pull-up node, a clock signal terminal, and the first output terminal, and configured to transmit, in response to the signal of the pull-up node, a signal of the clock signal terminal to the first output terminal;
- a second output circuit coupled to the pull-up node, the clock signal terminal and the second output terminal, and configured to transmit, in response to the signal of the pull-up node, the signal of the clock signal terminal to the second output terminal;
- a first reset circuit coupled to the third signal terminal, a first reset signal terminal, and the pull-up node, and configured to transmit, in response to a signal of the first reset signal terminal, the signal of the third signal terminal to the pull-up node; and
- a second reset circuit coupled to the third signal terminal, a second reset signal terminal and the pull-up node, and configured to transmit, in response to a signal of the second reset signal terminal, the signal of the third signal terminal to the pull-up node.

16. The gate driving circuit according to claim 11, wherein the first pull-down control circuit comprises:
- a seventh switch unit comprising a control terminal coupled to the second signal terminal, a first terminal coupled to the second signal terminal, and a second terminal coupled to the first pull-down control node;
- an eighth switch unit comprising a control terminal coupled to the first pull-down control node, a first terminal coupled to the second signal terminal, and a second terminal coupled to the first pull-down node;
- a ninth switch unit comprising a control terminal coupled to the pull-up node, a first terminal coupled to the third signal terminal, and a second terminal coupled to the first pull-down control node; and
- a tenth switch unit comprising a control terminal coupled to the pull-up node, a first terminal coupled to the third signal terminal, and a second terminal coupled to the first pull-down node.

17. The gate driving circuit according to claim 11, wherein the second pull-down control unit comprises:
- an eleventh switch unit comprising a control terminal coupled to the first signal terminal, a first terminal coupled to the first signal terminal, and a second terminal coupled to the second pull-down control node;

a twelfth switch unit comprising a control terminal coupled to the second pull-down control node, a first terminal coupled to the first signal terminal, and a second terminal coupled to the second pull-down node;

a thirteenth switch unit comprising a control terminal coupled to the pull-up node, a first terminal coupled to the third signal terminal, and a second terminal coupled to the second pull-down control node; and a fourteenth switch unit comprising a control terminal coupled to the pull-up node, a first terminal coupled to the third signal terminal, and a second terminal coupled to the second pull-down node.

18. The gate driving circuit according to claim 15, wherein:

the input circuit comprises: a fifteenth switch unit comprising a control terminal coupled to the signal input terminal, a first terminal coupled to the signal input terminal, and a second terminal coupled to the pull-up node, the first output circuit comprises: a sixteenth switch unit comprising a control terminal coupled to the pull-up node, a first terminal coupled to the clock signal terminal, and a second terminal coupled to the first output terminal; and a capacitor coupled between the pull-up node and the first output terminal;

the second output circuit comprises: a seventeenth switch unit comprising a control terminal coupled to the pull-up node, a first terminal coupled to the clock signal terminal, and a second terminal coupled to the second signal output terminal;

the first reset circuit comprises: an eighteenth switch unit comprising a control terminal coupled to the first reset signal terminal, a first terminal coupled to the third signal terminal, and a second terminal coupled to the pull-up node; and the second reset circuit comprises: a nineteenth switch unit comprising a control terminal coupled to the second reset signal terminal, a first terminal coupled to the third signal terminal, and a second terminal coupled to the pull-up node.

19. The gate driving circuit according to claim 11, wherein durations of the high level and the low level output alternately from the first signal terminal are the same, and durations of the high level and the low level output alternately from the second signal terminal are the same.

20. The gate driving circuit according to claim 11, wherein the gate driving circuit is implemented in a display panel.

* * * * *